United States Patent [19]
Ishiguro

[11] Patent Number: 5,878,048
[45] Date of Patent: Mar. 2, 1999

[54] MASK ROM HAVING REDUNDANCY FUNCTION

[75] Inventor: Mitsuhiro Ishiguro, Kanagawa, Japan

[73] Assignee: NEC Corporation, Tokyo, Japan

[21] Appl. No.: 838,039

[22] Filed: Apr. 22, 1997

[30] Foreign Application Priority Data

Apr. 25, 1996 [JP] Japan .................................. 8-105211

[51] Int. Cl.⁶ .................................................. G06F 11/00
[52] U.S. Cl. ............................................................ 371/10.2
[58] Field of Search ................................. 371/10.2, 21.1, 371/21.2, 21.4, 21.6; 365/200, 230.03

[56] References Cited

U.S. PATENT DOCUMENTS 5,179,536  1/1993  Kasa et al. ................................ 365/200
5,388,076  2/1995  Ihara ......................................... 365/200

*Primary Examiner*—Vincent P. Canney
*Attorney, Agent, or Firm*—Young & Thompson

[57] ABSTRACT

A mask ROM having a redundancy function according to the present invention comprises a plurality of redundancy memory cells subjected to data write processing using a laser trimmer, a bit line connected to each of the plurality of redundancy memory cells, a sense amplifier connected to the redundancy bit line, a redundancy bit setting section for holding a setting result, and a switch section for selectively outputting an output from the sense amplifier as it is and an inverted output thereof in accordance with the setting result.

7 Claims, 5 Drawing Sheets

MASK ROM HAVING REDUNDANCY FUNCTION

FIELD OF THE INVENTION

The present invention relates to a mask ROM and, in particular, relates to a mask ROM capable of effectively rewriting data on redundancy cells of the mask ROM having a redundancy function.

DESCRIPTION OF THE RELATED ART

ROM (Read Only Memory) is usually used only for reading data and is characteristically a non-volatile memory which holds contents of data even after the power is shut down. In addition, having a simple structure and high integrity, it is suited for mass-production and cost-effective. Mask ROM is one kind of ROM.

The mask ROM is designed to provide a circuit on a semiconductor wafer using a mask on which data is written is formed during a manufacturing process in accordance with a program indicating a use's request. Thus, data written on the mask ROM cannot be changed after fabrication.

To write data on a mask ROM, there are proposed a method of causing a short-circuit between the source and drain of a memory cell by using a diffusion layer or ion implantation, and a method of electrically cutting connection by using a contact hole needed to connect a cell with a bit line or metal wiring layer.

Meanwhile, demand for improving yield is rising as a memory capacity is becoming larger. To meet such demand, there is proposed a mask ROM wherein redundancy cells in addition to main memory cells are provided to fulfill a redundancy function for substituting a relief bit for a defective bit.

FIG. 1 is a flowchart illustrating a method of testing a mask ROM having a conventional redundancy function of this kind. As shown in FIG. 1, when test is started (in Step S11), it is judged whether or not a defective bit is present in main memory cells (in Step S12). If it is present, the defective bit is detected (in Step S13). A minimum substitute unit of a memory cell group (such as a bit line) in the main memory where the defective bit is present, is calculated (in Step S14). Thereafter, data to be written on the defective bit is automatically written in a corresponding redundancy cell area (in Step S15). The data-written redundancy cell area is tested to confirm that it operates normally (in Step S16).

Description will be given to the method of writing data in a redundancy cell to substitute for defective data in, for example, a 4M-bit mask ROM having redundancy function, according to the above-described prior art test flow shown in FIG. 1. A cell consists of word number×digit number=2048 bits×2048 bits. A minimum substitute unit of the redundancy cell is a digit line or 2048 bits. The redundancy cell is being connected to a bit line (that is, on-bit cell) prior to write processing. If the on-bit-cell is selected, an expected value thereof is "0". If a redundancy cell which are not being connected to a bit line (that is, off-bit cell) is selected, an expected value thereof is "1".

Assume that a defective bit is present in the 4M-bit mask ROM and not an expected value of "1" but "0" is output. Furthermore, assume that an expected value of a memory cell connected to a minimum substitute unit including the defective bit, that is, to a digit line is "1". In this case, an expected value of "1" is substituted for that of a designated redundancy cell (that is, a digit line). Since an expected value of the unprocessed redundancy cell is "0", it is certainly required to write data 2048 times in the redundancy cell in the prior art mask ROM having a redundancy function.

If a laser trimmer is used in the write processing, it takes 2048 bits×0.1 second=204.8 seconds to write data in a minimum substitute unit, provided data write time per bit is 0.1 second. According to the method of relieving a detective bit in the prior art redundancy mask ROM, therefore, an expected value applied to the minimum substitute unit where a defective bit is present, is automatically written in the corresponding redundancy cell area, irrespectively of the number of write processing targets or the number of bits.

As described above, the disadvantage of the prior art mask ROM is that a preset expected value of the minimum substitute unit where a defective bit is present, is automatically written in the corresponding redundancy cell area, irrespectively of the number of memory cells to be subjected to data write processing. Due to this disadvantage, the larger the number of data-write target memory cells is, the longer it takes to write data in the redundancy cell area. If the memory capacity becomes larger in the future, write data processing will take greater time, thereby decreasing productive efficiency.

SUMMARY OF THE INVENTION

It is therefore the object of the present invention to provide a mask ROM which can reduce write processing time and steps needed for rewrite data to a redundancy cell.

A mask ROM having a redundancy function according to the present invention comprises a plurality of redundancy memory cells subjected to data write processing using a laser trimmer; a redundancy bit line connected to each of the plurality of redundancy memory cells; a sense amplifier connected to the redundancy bit line; redundancy bit setting means for holding a setting result; and switch means for selectively outputting an output from the sense amplifier as it is and an inverted output thereof in accordance with the setting result.

BRIEF DESCRIPTION OF THE DRAWINGS

This above-mentioned and other objects, features and advantages of this invention will become more apparent by reference to the following detailed description of the invention taken in conduction with the accompanying drawings, wherein.

DETAILED DESCRIPTION OF THE INVENTION

Figure 1:
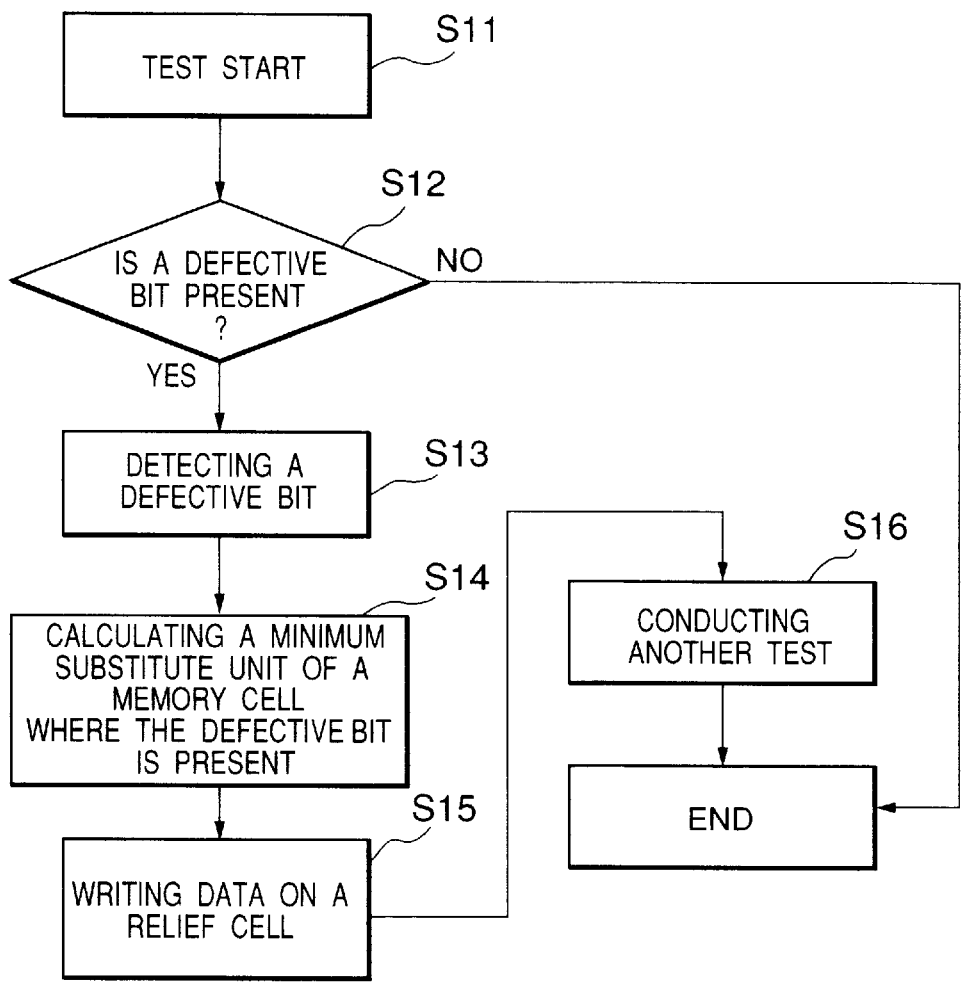
FIG. 1 is a flowchart showing a method of testing a mask ROM according to Prior Art.
Figure 2:
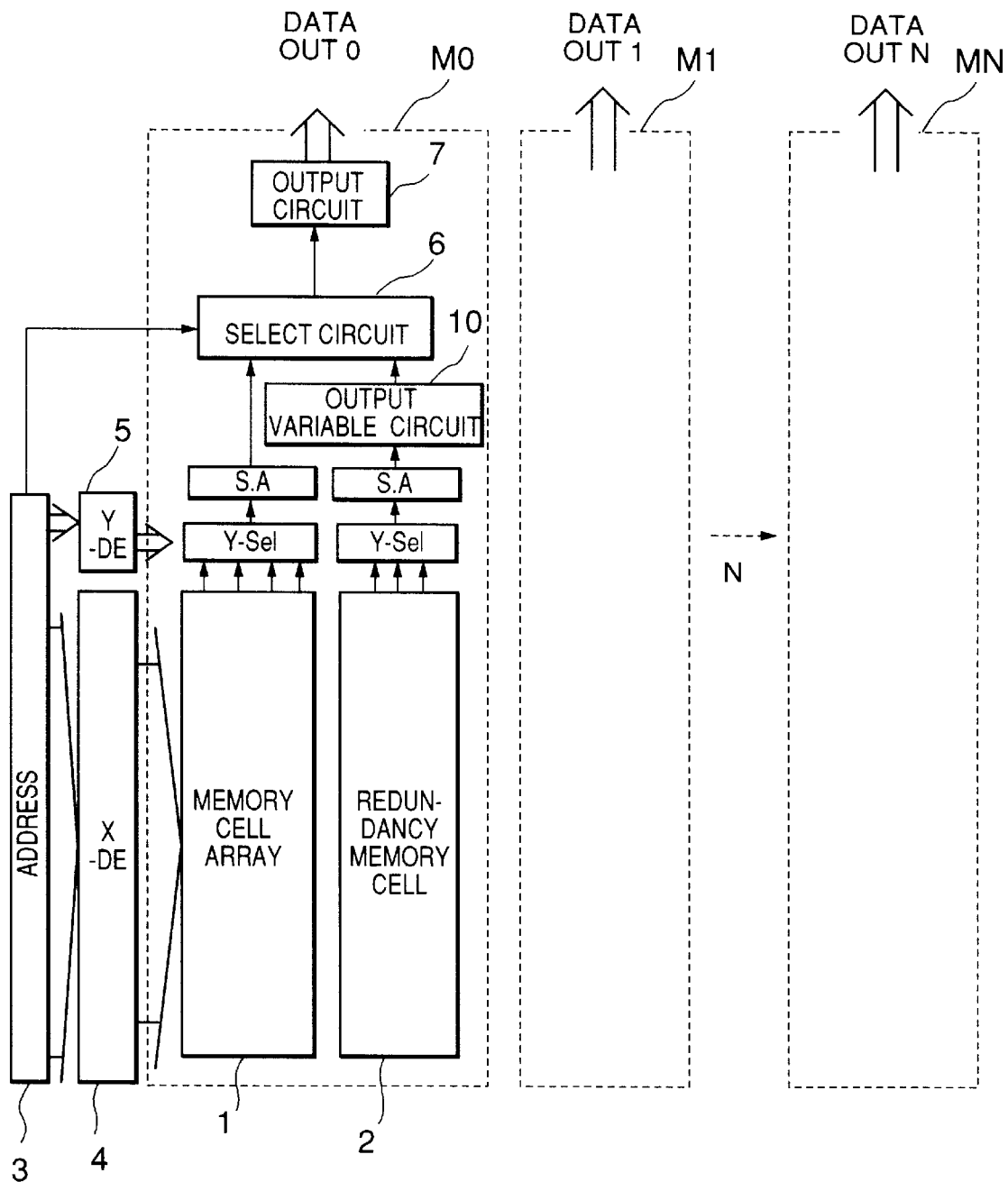
FIG. 2 is a block diagram showing an embodiment according to the present invention.

The embodiment according to the present invention will be described with reference to FIG. 2. FIG. 2 shows the structure of the entirety of a mask ROM of N-bit output. In this embodiment, the mask ROM is provided with output blocks M0 to MN, each including memory cell array 1, for respective output bits. Since the output blocks have the same in structure, description is given only to the structure of the output block M0.

The output block M0 has the memory cell array 1 and redundancy memory cell 2. An address supplied from address buffer 3 is decoded at X decoder 4 and Y decoder 5. Normally, one-bit data in the memory cell array is read in accordance with an input address and is output through sense amplifier SA. If the X decoder 4 and the Y decoder 5 detect that the input address indicates a defective cell, the redundancy memory cell 2 is selected and substitute data is input, through the sense amplifier SA, to output variable circuit 10.

Select circuit 6 selects either the read data of the memory cell array 1 or that of the redundancy memory cell 2 in accordance with the input address, and outputs the selected read data to output circuit 7.

Figure 3:
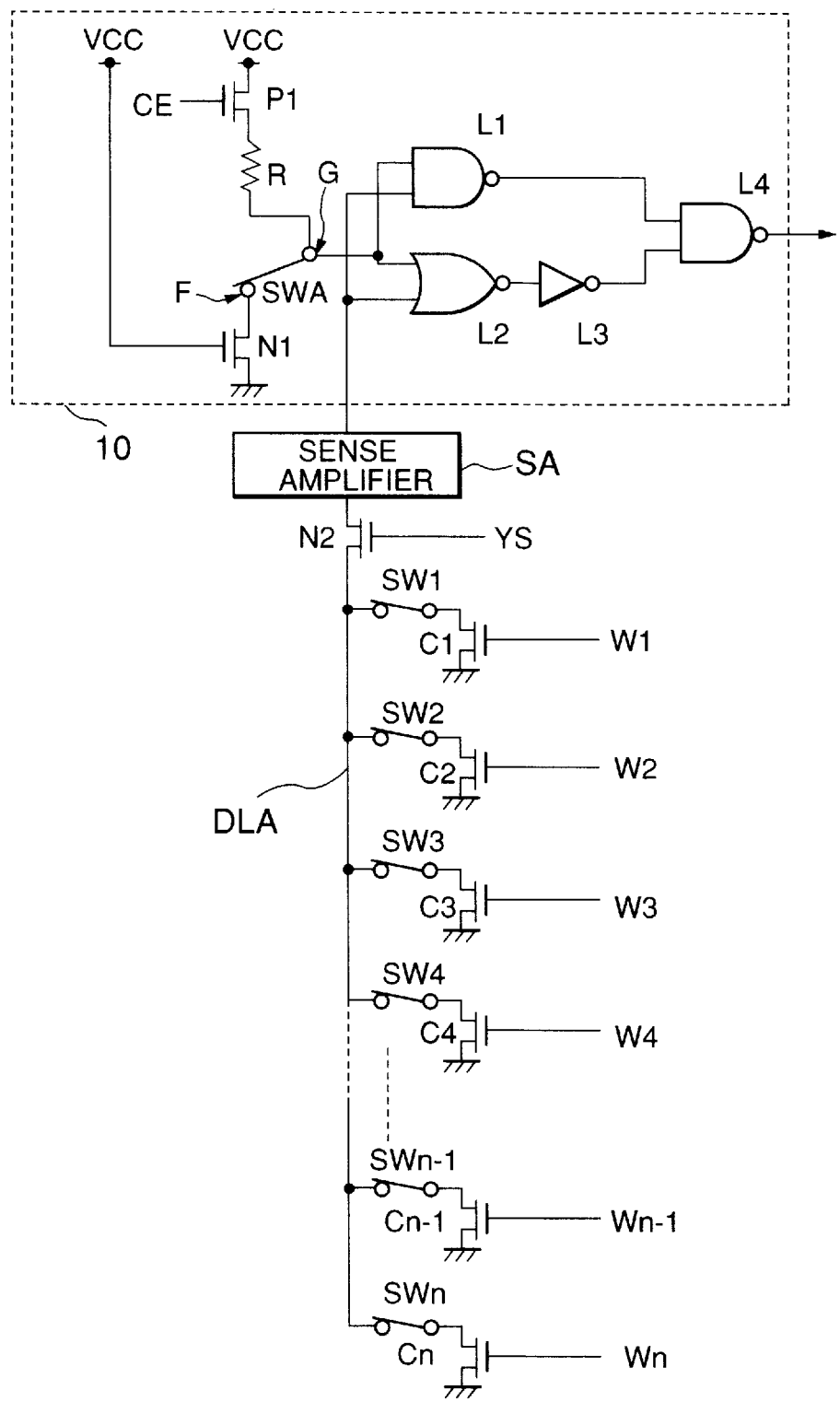
FIG. 3 is a circuit diagram showing part of the block diagram of FIG. 2 in more detail.

Structures of the redundancy memory cell 2 and the output variable circuit 10 will now be described in more detail with reference to FIG. 3.

The redundancy memory cell has a digit line DLA serving as a redundancy bit line. Memory cell C1 is connected, through switch SW1, to the digit line DLA and word line W1 is connected to the gate electrode of the memory cell C1. Likewise, memory cells C2 to Cn are connected, through switches SW2 to SWn, respectively, to the digit line DLA and word lines W2 to Wn are connected to gate electrodes of the memory cells C2 to Cn, respectively. The digit line DLA is connected, through transistor N2 controlled by digit line selection signal YS, to the sense amplifier SA. The output of the sense amplifier SA is connected to the output variable circuit 10. The output variable circuit 10 consists of a switch circuit serving as redundancy bit setting means and a logic circuit selectively outputting the output data of the sense amplifier SA in response to the output of the switch circuit. P-channel type MOS transistor P1, resistor R, switch SWA and n-channel type MOS transistor N1 are inserted in series between power potential and ground potential. Chip enable signal SE is input to the gate electrode of the p-channel type MOS transistor P1. The power potential is connected to the gate electrode of the n-channel type MOS transistor N1. The series contact point G between the resistor R and the n-channel type MOS transistor N1 is connected to both one input terminal of switch logic section NAND circuit L1 and that of NOR circuit L2. The output terminal of the sense amplifier SA is connected to another input terminal of L1 and that of L2. The output terminal of the NAND circuit L1 is directly connected to one input terminal of NAND circuit L4 and the output terminal of the NOR circuit L2 is connected through inverter L3 to another input terminal of the NAND circuit L4.

The memory cells C1, C2, C3, C4 . . . Cn-1, Cn are redundancy cells, each of which consists of an n-channel type MOS transistor. When the n-channel type MOS transistor N2 controlled by the digit line selection signal YS is turned ON and a cell selection level of "1" is input to one of the word lines W1 to Wn, the memory cells C1 to Cn output, through the switches SW1 to SWn, a certain level of data to the digit line DLA. The output data is amplified at the sense amplifier SA. The sense amplifier SA outputs a low level of data if one of the switches SW1 to SWn connected to the selected memory cell is turned ON. The amplifier outputs a high level of data if the switch connected thereto is turned OFF.

The bit connected to the digit line DLA through one of the switches SW1 to SWn is a on-bit and the bit which is not connected to the DLA is a off-bit.

The switching of the switches SW1 to SWn is usually externally processed by using a laser trimmer.

The p-channel type MOS transistor P1 supplies high level to the logic circuits of both the NAND circuit L1 and the NOR circuit L2 through the resistor R when the chip enable signal CE is at an active level, that is (in this embodiment), a low level. The N-channel type MOS transistor N1 supplies, through the switch SWA, low level to the NAND circuit L1 and NOR circuit L2.

The resistor R is set to have a resistance value such that the contact point G is at low level when the switch SWA is turned ON. Namely, the level of the contact point G is low when the switch SWA is turned ON and high when the switch SWA is turned OFF. If the level of the contact point G is low, data in phase with cell data is output by the NAND circuit L1, NOR circuit L2, inverter L3 and NAND circuit L4. If high, data opposite in phase to the cell data is output. The data is output externally through the output circuit 7.

The output variable circuit 10 is, thus, constituted by the circuit section consisting of the p-channel type MOS transistor P1, the n-channel type MOS transistor N1, the switch SWA, the resistor R, the NAND circuit L1, the NOR circuit L2, the inverter L3 and the NAND circuit L4. Such a structure makes it possible to arbitrarily relate write data to an expected value.

Figure 4:
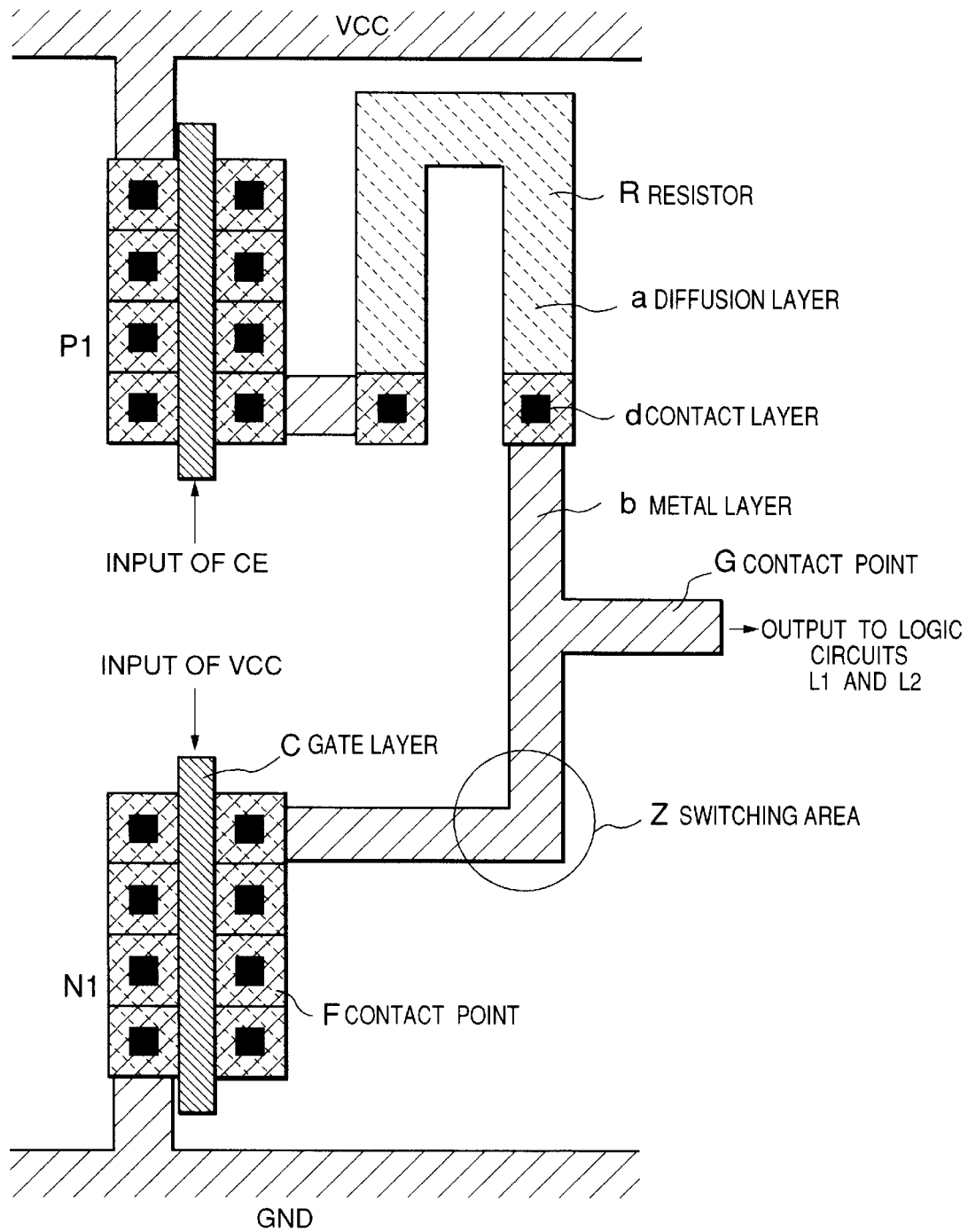
FIG. 4 shows part of the flat pattern of an output variable circuit shown in FIG. 3.

Refer now to FIG. 4 showing the mask pattern of the switch circuit. Specifically, FIG. 4 illustrates the mask pattern of the p-channel type MOS transistor P1, the n-channel type MOS transistor N1 and the resistor R. Reference symbol a denotes a diffusion layer, b denotes a metal wiring layer, c denotes a gate layer and d denotes a contact layer. Area Z surrounded by a circle denotes a switching area.

The area Z which is formed of the metal wiring layer b, is usually in a connection state. If the metal wiring layer is connected at the area Z, the switch SWA is turned ON. If disconnected, the switch SWA is turned OFF. The metal wiring layer b is an aluminum wiring layer which has been formed in the later stage of the manufacturing process. It is therefore the upper-most metal wiring layer.

Figure 5:
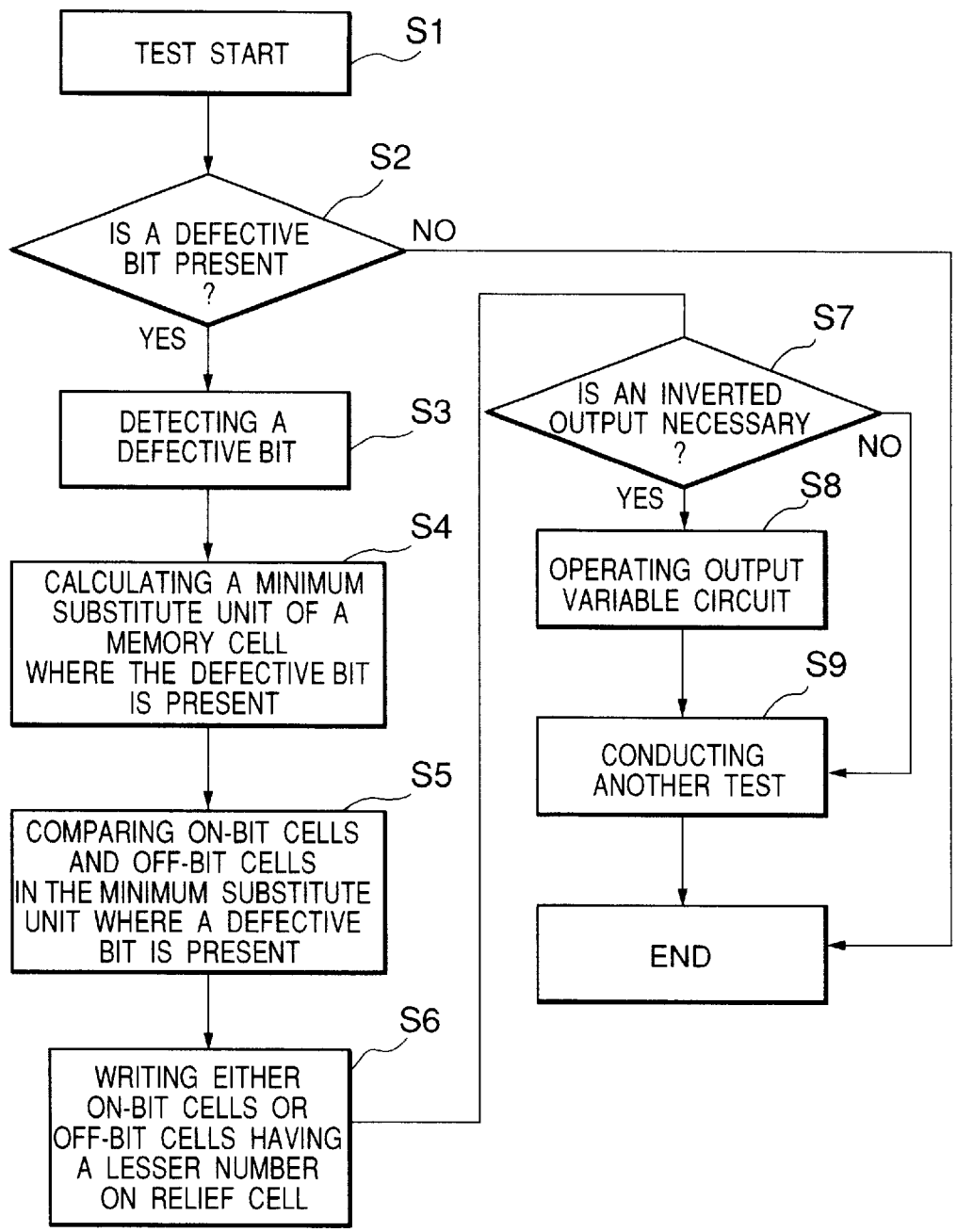
FIG. 5 is a flowchart showing a method of testing a mask ROM according to the present invention.

The test method according to the present invention will now be described with reference to FIG. 5. When the test is started (in Step S1), it is judged whether or not a defective bit is present in main memory cells (in Step S2). If it is judged that it is present, the defective bit is detected (in Step S3).

A minimum substitute unit of a memory cell group is calculated from among the main memory where the detected defective bit is present (in Step S4). The number of on-bit cells and that of off-bit cells in the minimum substitute unit calculated in Step S4 is compared (in Step S5).

Based on a comparison result, either on-bit cells or off-bit cells having a lesser number are selected and the selected data is written on the redundancy cell (in Step S6). Specifically, one of the switches SW1 to SWn of the cell subjected to data write processing is turned OFF by controlling the switches SW1 to SWn.

Next, it is judged whether the phase of the written data is the same as that of the expected value or opposite thereto (in Step S7). If the written data is in phase with the expected value, that is, the off-bit cells are less than the on-bit cells, then the contacts points F and G of the switch SWA are connected by connecting the metal wiring layer area Z. If the written data is in opposite phase, that is, the on-bit cells are less than the off-bit cells, then the contact points F and G are disconnected by disconnecting the metal wiring layer area Z to turn OFF the switch SWA (in Step S8). After another test is conducted to confirm that the written data operates normally (in Step S9), test is finished.

The present invention is aimed to shorten write processing time by executing the above-described test flow.

Expected values of both on-bit cells and off-bit cells can be arbitrarily selected by using the above-mentioned output variable circuit 10. In the test flow above, the number of on-bit cells and that of off-bit cells in the minimum substitute unit where a defective bit is present, are compared with each other. Based on the comparison result, the expected value of the lesser number of either on-bit or off-bit cells is determined as write data. This makes it possible to reduce the number of write processing targets and to thereby reduce write processing time and steps.

The on-bit cells and off-bit cells in the minimum substitute unit are, in most cases, different in number. The average ratio of the on-bit cells to the off-bit cells is about 6:4 or 4:6.

Here, assume that there are 20480 bits of redundancy cells and write processing time per bit is 0.1 second.

According to the prior art, 60 percent of the 2048 bits of redundancy cells are subjected to write processing and the write processing time is 122.88 seconds in total. Meanwhile, according to the present invention, the expected value of either on-bit cells or off-bit cells having the lesser number is always selected as write data. As a consequence, only 40 percent of the 2048 bits of redundancy cells are subjected to writing processing.

According to the present invention, therefore, the total write processing time is 81.9 seconds, shorter than that of the prior art by 40.98 seconds. This advantage of the present invention will become more apparent in the future. The reason is that it is estimated that redundancy cells will be larger as the development of a larger capacity of memory.

According to the present invention, the output variable circuit can selectively output data in phase with cell data or opposite thereto in phase, by processing the metal wiring layer using, for example, a laser trimmer. Compared with the prior art method of making the output data variable by switching diffusion layers, the method of the present invention can use a laser trimmer to disconnect a metal wiring layer since disconnection is done in the later stage of the diffusion step.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A mask ROM having a redundancy function, comprising:

a plurality of redundancy memory cells subjected to data write processing using a laser trimmer;

a bit line connected to each of said plurality of redundancy memory cells;

a sense amplifier connected to said redundancy bit line;

redundancy bit setting means for holding a setting result; and switch means for selectively outputting an output from said sense amplifier as it is and an inverted output thereof in accordance with the setting result.

2. The mask ROM according to claim 1, wherein said redundancy bit setting means includes:

a transistor and a resistor provided in series between an output terminal and a first power terminal, said transistor having a gate electrode supplied with a control signal;

a metal wiring layer provided between said output terminal and a node, said metal wiring layer being capable of being processed by said laser trimmer; and connection means for connecting said node and a second power terminal.

3. The mask ROM according to claim 1, wherein said redundancy bit setting means includes:

a p-channel transistor and a resistor provided in series between a power terminal and an output terminal;

an aluminum wiring layer provided between said output terminal and a node; and an n-channel transistor provided between said node and a ground terminal, and wherein a gate electrode of said p-channel transistor is supplied with a control signal and a gate electrode of said n-channel transistor is supplied with a power voltage.

4. The mask ROM according to claim 1, wherein the number of redundancy memory cells disconnection-processed by said laser trimmer is always not more than a half of said plurality of redundancy memory cells.

5. A mask ROM having a redundancy function, comprising:

a plurality of redundancy memory cells to be set in one of an on-bit state and an off-bit state by laser trimmer processing;

a bit line connected to each of said plurality of redundancy memory cells;

a sense amplifier connected to said redundancy bit line;

redundancy bit setting means for holding a setting result corresponding to a result of said laser trimmer processing; and switch means for selectively outputting an output from said sense amplifier as it is and an inverted output thereof in accordance with the setting result.

6. The mask ROM according to claim 4, wherein said redundancy bit setting means includes:

a transistor and a resistor provided in series between an output terminal and a first power terminal, said transistor having a gate electrode supplied with a control signal;

a metal wiring layer provided between said output terminal and a node, said metal wiring layer being capable of being processed by said laser trimmer; and connection means for connecting said node and a second power terminal.

7. The mask ROM according to claim 5, wherein the number of redundancy memory cells disconnection-processed by said laser trimmer is always not more than a half of said plurality of redundancy memory cells.

* * * * *